(12) United States Patent
Mueller et al.

(10) Patent No.: US 6,355,964 B1
(45) Date of Patent: Mar. 12, 2002

(54) MICROELECTRONIC INTEGRATED SENSOR

(75) Inventors: Karlheinz Mueller, Waldkraiburg; Stefan Kolb, Unterschleissheim, both of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/627,734

(22) Filed: Jul. 28, 2000

Related U.S. Application Data

(62) Division of application No. 09/195,935, filed on Nov. 19, 1998, now Pat. No. 6,136,631, which is a division of application No. 08/723,845, filed on Sep. 30, 1996, now Pat. No. 5,886,261.

(30) Foreign Application Priority Data

Sep. 28, 1995 (DE) .......................... 195 36 250

(51) Int. Cl.[7] .............................................. H01L 29/82
(52) U.S. Cl. .................... 257/415; 257/419; 73/514.36; 73/514.01
(58) Field of Search ......................... 73/514.32, 514.36, 73/514.37, 514.01; 257/415, 418, 419, 417

(56) References Cited

U.S. PATENT DOCUMENTS

| 4,882,933 A | 11/1989 | Petersen et al. |
|---|---|---|
| 5,006,487 A | 4/1991 | Stokes |
| 5,181,156 A | 1/1993 | Gutteridge et al. |
| 5,241,864 A | 9/1993 | Addle et al. |
| 5,258,097 A | 11/1993 | Mastrangelo |
| 5,262,000 A | 11/1993 | Welbourn et al. |
| 5,429,993 A | 7/1995 | Beitman |
| 5,510,290 A | 4/1996 | Kwon |
| 5,559,290 A | 9/1996 | Suzuki et al. |
| 5,587,343 A | 12/1996 | Kano et al. |
| 5,604,313 A | 2/1997 | Cahill et al. |
| 5,611,940 A | 3/1997 | Zettler |
| 5,784,212 A | * 7/1998 | Hornbeck |
| 5,830,777 A | 11/1998 | Ishida et al. |
| 5,834,332 A | 11/1998 | Hierold et al. |
| 5,861,673 A | 1/1999 | Yoo et al. |

FOREIGN PATENT DOCUMENTS

| DE | 43 38 056 A1 | 5/1992 |
|---|---|---|
| DE | 43 32 843 A1 | 4/1995 |
| DE | 44 23 396 A1 | 1/1996 |

* cited by examiner

*Primary Examiner*—John F. Niebling
*Assistant Examiner*—Viktor Simkovic
(74) *Attorney, Agent, or Firm*—Herbert L. Lerner; Laurence A. Greenberg; Werner H. Stemer

(57) ABSTRACT

A microelectronic integrated sensor is formed with a cantilever. For the purpose of ensuring a system which is especially invulnerable to mechanical strains during production, the cantilever is placed freely movably on a support, and motion limiters are provided on the edge. The invention also provides for the formation of nitride pillars for supporting the upper layers, in order to further increase the stability. A corresponding production process for producing the sensor is disclosed as well.

2 Claims, 2 Drawing Sheets

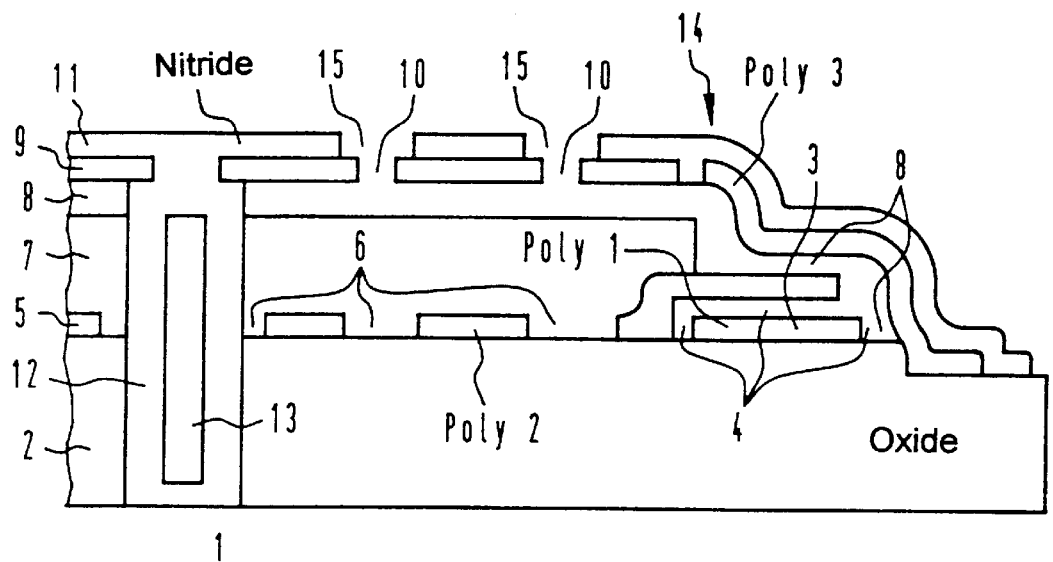
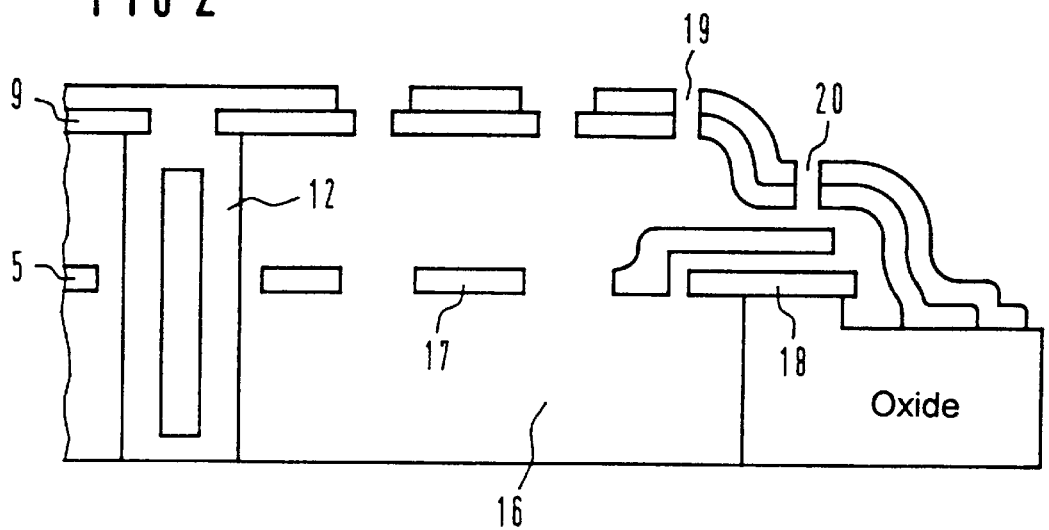

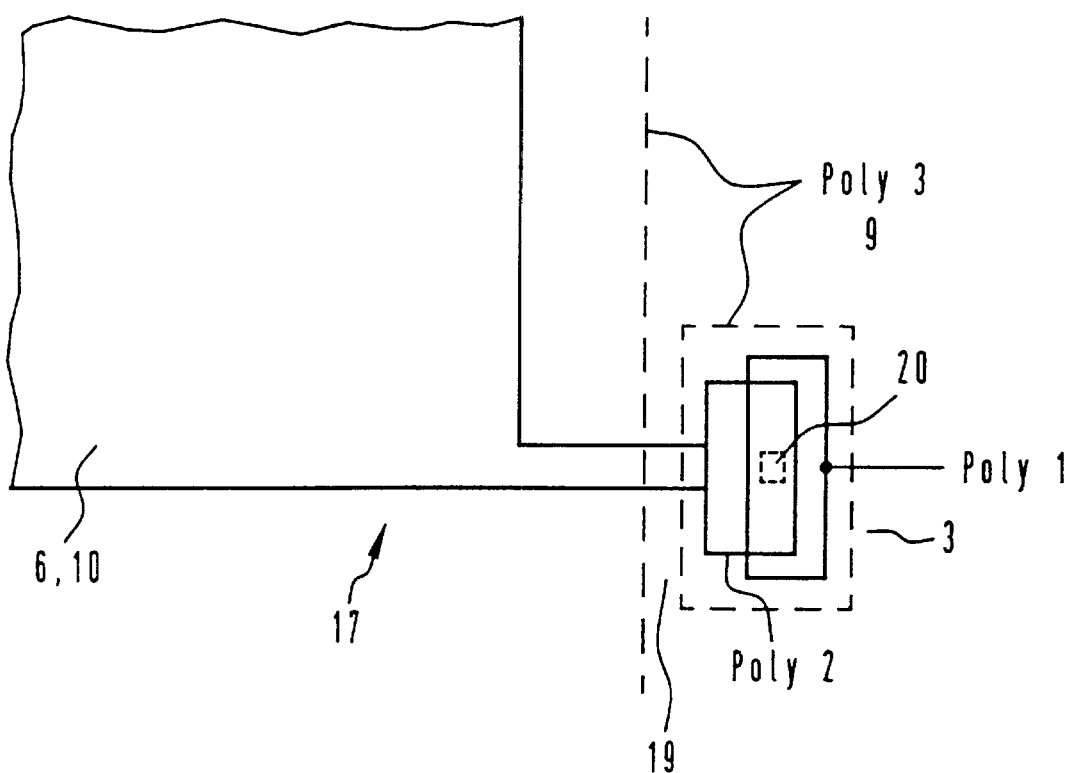

MICROELECTRONIC INTEGRATED SENSOR

CROSS-REFERENCE TO RELATED APPLICATION

This is a division of U.S. application Ser. No. 09/195,935, filed Nov. 19, 1998 now U.S. Pat. No. 6,136,631, which was a division of U.S. application Ser. No. 08/723,845, filed Sep. 30, 1996 which matured into U.S. Pat. No. 5,886,261.

BACKGROUND OF THE INVENTION:

Field of the Invention

The invention relates to a microelectronic integrated sensor, in which a cantilever is formed, and which in particular has a pillar, which to support the upper layers extends through a void. The invention also relates to a method for producing the sensor.

Such sensors are used for instance to measure acceleration. The cantilever, together with an upper and a lower electrode, acts as a series capacitor circuit, and changes in capacitance are evaluated as a measured variable. Typically, the formerly known cantilevers are anchored in the sensor via springs. The courses of the process in producing the sensor lead to stress, and particularly mechanical stress, however, in the cantilever. If the springs do not relax completely, the cantilever can sag permanently as a result. Moreover, the forces absorbed in the springs can cause incorrect behavior of the cantilever during operation. For mechanically stabilizing these sensors, top closure plates, which as a rule comprise a polysilicon layer, are supported with the aid of oxide pillars. The closure times can also be formed of a metallization and supported with metallizing pillars. In the case of aluminum pillars, however, the problem is that they must be insulated from the lower electrode, for instance by means of a diode. Nevertheless, leakage currents can still occur, which impair the function of the sensor. Oxide pillars can be made only within difficulty, since their embodiment is problematic and is strongly dependent on the etching times.

SUMMARY OF THE INVENTION

It is accordingly an object of the invention to provide a microelectronic integrated sensor, which overcomes the above-mentioned disadvantages of the heretofore-known devices and methods of this general type and which is not vulnerable to mechanical strain. A method for producing the sensor of the invention is also to be created.

With the foregoing and other objects in view there is provided, in accordance with the invention, a microelectronic integrated sensor, comprising: a cantilever disposed on a support, said cantilever having an edge; lateral and upper motion limiters spaced apart from said edge of said cantilever, said motion limiters allowing adequate compensating motions of said cantilever for reducing mechanical stress, and limiting the compensating motions only in a region of said support.

The sensor may be produced in a method which includes the following steps:
  forming a first oxide layer on a substrate;
  structuring a first polysilicon layer for forming the support;
  depositing a second oxide layer thereon and substantially covering the support;
  depositing, doping, and recrystallizing a second polysilicon layer for forming the cantilever;
  forming an array of holes in the second polysilicon layer in preparation for a subsequent isotropic etching of the first and second oxide layers;
  depositing and structuring a third oxide layer thereon;
  depositing a fourth oxide layer on the third oxide layer and on bared portions of the cantilever;
  forming a cover by depositing a third polysilicon layer;
  forming an array of holes in the third polysilicon layer for introducing an etchant; and
  forming the void in the microelectronic sensor by isotropic oxide etching.

With the above and other objects in view there is also provided, in accordance with the invention, an improved microelectronic integrated sensor of the type being formed with upper layers and a hollow chamber in which a cantilever is disposed, and a pillar extending through the hollow chamber for supporting the upper layers; the improvement is found in the requirement that the pillar is a nitride pillar.

The sensor may be produced using the following method steps: depositing a plurality of oxide layers on a substrate; depositing a polysilicon layer thereon and forming a cover; structuring an array of holes in the polysilicon layer, and defining pillar holes of the array of holes at each location intended for forming a pillar, and other holes where no pillar is intended; carrying out anisotropic oxide etching with an isotropic component in the pillar holes; applying a nitride layer such that the nitride enters a void created in the foregoing step and forms a nitride pillar; removing the nitride layer in a region of the other holes; and carrying out isotropic oxide etching through the other holes of the array of holes for forming the hollow chamber.

It is an essential concept of the invention that the cantilever is placed on a support; lateral and upper motion limitations are present, which are spaced apart from one edge of the cantilever in such a way that on the one hand adequate compensatory motions of the cantilever are possible in order to reduce mechanical stress, and on the other the compensatory motions are possible only in the region of the support.

In this way, a completely and freely relaxable cantilever is created, which is placed on the support, such as bearing points, on which it can move substantially freely and is limited laterally and from above in its motion so far that displacement or slipping beyond the supporting bearing points is prevented.

The support, in an especially preferred embodiment, is made of a polysilicon layer, so that the direct, continuous contact of the cantilever with the bearing takes place only between the, polysilicon of the cantilever and the polysilicon of the support.

The support and the motion limitation can favorably also be embodied as a unit; preferably, a receptacle that surrounds the outer edge of the cantilever like a blind bore is provided. It can also be said that the cantilever is received in slitlike or groovelike fashion. The motion limitations and the support are preferably provided in the entire circumferential region of the cantilever. A point-type bearing may also be present, however.

The motion limitation may also be functionally integrated into the support in such a way that the cantilever is stepped in embodiment, so that on one side it rests on the bearing point, and the step would hit the bearing points in the event of slippage. By planarizing the oxide layer on which the cantilever is formed, it is also possible to produce a straight cantilever.

In a preferred embodiment, the motion limitation is in the form of a pillar, which is guided by a recess formed in the cantilever. The motion limitation in this case accordingly does not engage the outer edge of the cantilever but rather the edge of the cantilever formed in the receptacle.

In a further substantial concept of the invention, the microelectronic sensor has a pillar comprising nitride, which extends through the void of the sensor and as a result supports the upper layers of the sensor, which as a rule comprise polysilicon, against the bottom. This increases the stability of the sensor, and no electrical insulation problems arise.

The nitride pillars are preferably embodied with a void, since this form is especially easy to produce.

In the method for producing a microelectronic integrated sensor, with a cantilever, formed in a void, in an essential concept of the invention a first oxide is created on a substrate; a first polysilicon layer is deposited and structured to form a cantilever bearing; over that, a second oxide layer is deposited; in the next step, a second silicon layer for cantilever formation is deposited, doped and recrystallized; in the second polysilicon layer an array of holes is structured, which serves to pass through the oxide etching performed at the end of the process sequence; a third and fourth oxide layer are applied and structured; a third polysilicon Layer for forming cap is applied; an array of holes is structured in the third polysilicon layer, and by means of this array of holes an isotropic etching of the four oxide layers located beneath, with the exception of a portion of the first oxide layer is located under the structure of the first polysilicon layer, is performed to form the void.

With this method, a cantilever is formed in a void inside a sensor and rests on a bearing point formed out of the first polysilicon layer.

To prevent the cantilever, formed of the second polysilicon layer, from sticking by suction of the polysilicon layer or some other face in cooperation with the etching liquid during the oxide etching to form the void, it is advantageous to provide resist pillars during the production process. They can be formed in a simple way by creating the array of holes in two stages in the third polysilicon layer. With a first phototechnique, holes are structured, distributed over the surface. An anisotropic oxide etching with a partial isotropic component is performed above these holes. Resist is placed in the resultant voids, and to create the other holes of the array of holes in the third polysilicon layer, a resist mask is again applied, which now leaves the holes now to be created bare, and covers the first holes that were created before. The previously etched voids fill with resist in the process, and, because of the isotropic component of the previous etching, they engage the second polysilicon layer from below. To form these resist pillars, it is necessary that the holes used for them in the array of holes at the second polysilicon layer substantially match the holes of the third polysilicon layer. Finally, the resist is removed from the fully etched void, so that the cantilever is disposed in a freely movable manner.

In another essential concept of the invention, to form a pillar in the void of the sensor, a method sequence is employed in which various oxide layers are applied, which later form the void; a polysilicon layer that later forms the cap is deposited onto the oxide layers and is structured with a phototechnique and then etched; an anisotropic oxide etching with an isotropic component is performed through the etched hole in the polysilicon layer; a nitride coating is applied, which also fills the previously etched void and thus forms a nitride pillar; and through other holes etched in the polysilicon layer, oxide etching for forming the void around the pillar is performed.

In the forming of the cantilever, which is formed of a further polysilicon layer disposed between the oxide layer, it is preferred chat a larger recess be structured at the point of the later pillar, so that the pillar is passed through the cantilever, spaced apart from it.

In the polysilicon layer that forms the cap, an array of holes is favorably created, through which the later etching operations are performed. One hole is selected for the performance of the step for nitride pillar production, and the holes located around it are used to etch the oxide layers.

In a further feature of the invention, the various oxide layers are formed of materials with different etching rates, so that when the void is etched, the forming of the desired void can be controlled by the choice of an oxide layer having a suitable etching rate. However, in this embodiment, because of the use of the first polysilicon layer as a bearing point and simultaneously as an etching stop, it is also possible to use oxide layers with the same etching rate for a portion of the oxide located beneath this polysilicon layer.

Other features which are considered as characteristic for the invention are set forth in the appended claims.

Although the invention is illustrated and described herein as embodied in a microelectronic integrated sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic section through a microelectronic sensor with a cantilever during the production process;

FIG. 2 is a similar view of the microelectronic sensor with a cantilever and a nitride pillar towards the end of the production process; and FIG. 3 is a partly sectional plan view onto the sensor.

DESCRIPTION OF THE PREFERRED EMBODIMENTS

Referring now to the figures of the drawing in detail and first, particularly, to FIG. 1 thereof, there are seen various layers of material, applied and structured in various method steps. Beginning with a substrate 1, a first, relatively thick oxide layer 2 is created. Over it, a first polysilicon layer 3 is applied, which is structured with a phototechnique so as later to form a bearing point for the cantilever. After that, a second oxide layer 4 is applied, whose essential task is to cover the bearing point 18 formed out of the first polysilicon layer 3. Outside this region, the oxide layer is removed again, so that as shown in FIG. 1, in the next step a second polysilicon layer 5 can be applied. However, it would also be possible not to etch this second oxide layer 4 away in some regions, so that the second polysilicon layer 5 would then be formed entirely on the level of the raised step shown in the right-hand region of the polysilicon layer 5.

The second silicon layer 5 is doped and is recrystallized with a high-temperature treatment, and in the process the dopants are also activated. Next, an array of holes 6 is created in the polysilicon layer 5 by structuring, with the aid of a phototechnique and ensuing etching. The array of holes 6 serve to layer carry the etching liquid through to the regions located under the polysilicon layer 5, so as to create the voids.

At places where nitride props or pillars are later to be made, an adapted hole, that is, a hole that is sufficiently large to avoid collision with the cantilever, is made in the polysilicon layer 5. Onto this second polysilicon layer 5, a third oxide layer 7 is applied, planarized and densified. With a phototechnique, the oxide layer 7 is structured, so that it ends in the region of the arrow 14, and in the next step a further, fourth oxide layer 8 is applied, which extends over the third oxide layer and the second polysilicon layer 5. In the next step, a third polysilicon layer 9 is applied, which forms the covering of the sensor. It is doped and, in a high-temperature step, recrystallized. In the process, tile dopants are activated.

To define the outer dimensions of the sensor and to create an array of holes 10 in the third polysilicon layer 9, the polysilicon layer 9 is structured with the aid of a phototechnique and then etched at the appropriate points. A dry, anisotropic oxide etching with an isotropic component is performed, distributed over the surface in some holes of the array of holes 10, in order to create a void in the oxide layers, in which void a pillar can be formed. The void extends essentially at right angles from the third polysilicon layer 9 downward as far as the substrate 1 and leads through the adapted, large hole in the array of holes 10 of the second polysilicon layer 5. Next, a nitride layer 11 is applied, which also fills the previously made void, forming a nitride prop or pillar 12. The nitride deposits predominantly on the walls, resulting in a void 13 in the interior of the nitride pillar 12. Since the previous etching of the void has an isotropic component, the void and thus the nitride pillar 12 as well extends underneath the third polysilicon layer 9, engaging it, and therefore supports it.

To carry out the rest of the method, the nitride layer 11 is dry-etched, forming holes 15, above all in the region of the array of holes 10 located beneath. In the next step, an isotropic etching of the oxide layers can then be done to form a void, through the holes in the polysilicon layer 9 and the nitride layer 11. First, however, an anisotropic dry oxide etching is performed only at some points, with an isotropic component, thereby forming further voids 16. The isotropic component must be so large that the void also encompasses regions of the second polysilicon layer 5 that forms the cantilever. These voids are filled with resin in an ensuing phototechnique, so that resin pillars are formed in the sensor; during the ensuing oxide etching, they hold the cantilever in a predetermined position and thus prevent sinking of the cantilever 17. In this way, the cantilever is prevented from sticking by suction during the oxide etching under the influence of the etching liquid. After the etching of the void, the resist pillars are removed again.

The holes of the array of holes 10, which are formed in the third polysilicon layer 9, are geometrically smaller than the holes of the array of holes 6 in the second polysilicon layer 5, since the first-mentioned holes have to be closed again at the end.

The result is the structure shown in FIG. 2, with the bearing point 18, which is formed out of the first polysilicon layer 3, which is also called an auxiliary layer; the cantilever 17, which is formed out of the second polysilicon layer; and the covering, which essentially comprises the third polysilicon layer 9. The holes still present in the region of the covering formed of the third polysilicon layer 9 are covered and closed with an oxide or boron phosphorus silicate glass (BPSG). At some suitable point, a contact hole 20 is etched, and through it a metal contact is passed to the cantilever 17 located beneath. In this process, care must be taken that the metal contact have no contact with the polysilicon layer 3 in the region of the array of holes 6. This is done by means of an interruption 19 in the polysilicon layer 3. The sensor can now function as intended, as a result of the varying capacitances between the cantilever 17 and the polysilicon layer 9 on the one hand and between the cantilever 17 and the substrate 1 on the other.

FIG. 3 shows a plan view on the sensor, in which the dashed line indicates the outer dimensions that are determined by the third polysilicon Layer 9. The third polysilicon layer covers not only the main region of the cantilever 17 but also the continuation of the cantilever 17, shows at the lower right, in which the bearing point 18 formed out of the first polysilicon layer 3 is also located. The third polysilicon layer 9 is embodied separately in these two regions, in order to avoid electrical contact with the cantilever 17. Both the array of holes 6 of the second polysilicon layer and above it the array if holes 10 of the third polysilicon layer 9 are disposed in the central region of the cantilever 17.

We claim:

1. An improved microelectronic integrated sensor of the type being formed with upper layers and a hollow chamber in which a cantilever is disposed, and a pillar extending through the hollow chamber for supporting the upper layers, the improvement which comprises:

the pillar is formed of nitride.

2. The sensor according to claim 1, wherein said nitride pillar has a void formed in an interior thereof.

* * * * *